(12) United States Patent
Passlack

(10) Patent No.: US 7,432,565 B2
(45) Date of Patent: Oct. 7, 2008

(54) III-V COMPOUND SEMICONDUCTOR HETEROSTRUCTURE MOSFET DEVICE

(75) Inventor: Matthias Passlack, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 216 days.

(21) Appl. No.: 11/236,185

(22) Filed: Sep. 27, 2005

(65) Prior Publication Data

US 2007/0069240 A1    Mar. 29, 2007

(51) Int. Cl.
*H01L 29/20* (2006.01)
(52) U.S. Cl. ............. 257/403; 257/192; 257/E29.089
(58) Field of Classification Search ........... 257/289, 257/403, E29.089, E29.091, E29.296, E29.09; 438/172, 191, 216
See application file for complete search history.

(56) References Cited

U.S. PATENT DOCUMENTS

| | | | | |
|---|---|---|---|---|
| 5,196,907 A | * | 3/1993 | Birkle et al. | ............ 257/289 |
| 5,902,130 A | | 5/1999 | Passlack et al. | |
| 5,929,467 A | * | 7/1999 | Kawai et al. | ............ 257/192 |
| 6,369,408 B1 | * | 4/2002 | Lotfi et al. | ............ 257/57 |
| 6,522,158 B1 | | 2/2003 | Fung et al. | |
| 6,597,193 B2 | | 7/2003 | Lagowski et al. | |
| 6,680,621 B2 | | 1/2004 | Savtchouk et al. | |
| 6,771,092 B1 | | 8/2004 | Fung et al. | |
| 2003/0013266 A1 | * | 1/2003 | Fukuda et al. | ............ 438/400 |
| 2003/0137018 A1 | | 7/2003 | Passlack et al. | |
| 2004/0137673 A1 | | 7/2004 | Passlack et al. | |
| 2004/0206979 A1 | * | 10/2004 | Braddock | ............ 257/192 |
| 2005/0062048 A1 | * | 3/2005 | Hayashi et al. | ............ 257/77 |
| 2006/0054937 A1 | * | 3/2006 | Lucovsky et al. | ............ 257/213 |

FOREIGN PATENT DOCUMENTS

JP          1082671          3/1989

* cited by examiner

*Primary Examiner*—Carl Whitehead, Jr.
*Assistant Examiner*—Jennifer M Dolan
(74) *Attorney, Agent, or Firm*—Michael J. Balconi-Lamica

(57) ABSTRACT

A III-V based, implant free MOS heterostructure field-effect transistor device comprises a gate insulator layer overlying a compound semiconductor substrate; ohmic contacts coupled to the compound semiconductor substrate proximate opposite sides of an active device region defined within the compound semiconductor substrate; and a gate metal contact electrode formed on the gate insulator layer in a region between the ohmic contacts. The ohmic contacts have portions thereof that overlap with portions of the gate insulator layer within the active device region. The overlapping portions ensure avoidance of an undesirable gap formation between an edge of the ohmic contact and a corresponding edge of the gate insulator layer.

14 Claims, 2 Drawing Sheets

III-V COMPOUND SEMICONDUCTOR HETEROSTRUCTURE MOSFET DEVICE

CROSS-REFERENCE TO CO-PENDING APPLICATIONS

This application is related to co-pending patent application Ser. No. 10/882,482, entitled "Method of Passivating Oxide/Compound Semiconductor Interface," filed Jun. 30, 2004; Ser. No. 11/236,186, entitled "Process of Making A III-V Compound Semiconductor Heterostructure MOSFET," filed concurrently herewith, Ser. No. 11/236,187, entitled "Charge Compensated Dielectric Layer Structure and Method of Making the Same," filed concurrently herewith, all assigned to the assignee of the present disclosures and incorporated herein by reference.

BACKGROUND

The present disclosures relate to semiconductor structures, and more particularly, to a process and structure of a III-V compound semiconductor heterostructure MOSFET.

In III-V compound semiconductor process technology, there exists a need for a compound semiconductor heterostructure MOSFET process flow that facilitates the use of a GdGaO/Ga$_2$O$_3$ dielectric stack as a gate oxide. In addition, in an absence thereof, there is a need for an implant-free enhancement mode structure and process. Some examples of implant free MOSFETs are discussed in a co-pending patent application Ser. No. 10/339,379, entitled "An Enhancement mode Metal-Oxide-Semiconductor Field Effect Transistor," Matthias Passlack et al., filed Jan. 9, 2003, and are not discussed further here.

Accordingly, there is a need for an improved method and apparatus for overcoming the problems in the art.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
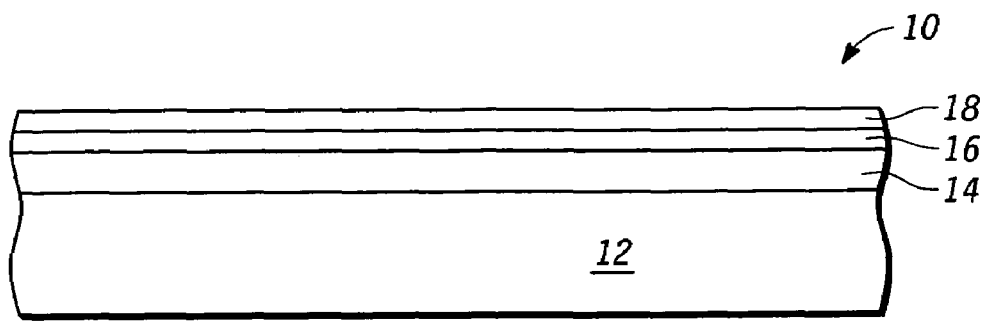
FIG. 1 is a cross-sectional view of a semiconductor structure during the manufacture thereof according to one embodiment of the present disclosure.

FIG. 1 is a cross-sectional view of a semiconductor structure 10 that includes a substrate 12, an epitaxial layer 14, a gate insulator layer 16, and a protective layer 18 for use with a method according to one embodiment of the present disclosure. Substrate 12 comprises any material suitable for a III-V semiconductor device structure. The epitaxial layer 14 comprises any epitaxial layer or stack of layers suitable for a III-V semiconductor device structure. Note that while only one epitaxial layer 14 is illustrated for simplicity, the epitaxial layer 14 can comprise a stack of one or more epitaxial layers. Gate insulator layer 16 comprises any dielectric layer or stack of dielectric layers suitable for a III-V semiconductor device structure.

In one embodiment, substrate 12 comprises a III-V compound semiconductor substrate with one or more layers 14 of III-V material epitaxially formed on an upper surface thereof (not shown). For purposes of this disclosure, the substrate and any epitaxial layers formed thereon will be referred to simply as a compound semiconductor substrate. For example, substrate 12 can comprise a III-V material such as GaAs or InP and epitaxial layer(s) 14 can comprise, for example, any suitable layer structure of In, Ga, P, As, Sb, or Al containing compounds.

In one embodiment, gate insulator layer 16 comprises a deposited gate oxide that has been deposited to a desired target thickness with use of a suitable oxide deposition system. The gate oxide is preferably deposited oxide to the desired thickness, as opposed to being deposited beyond the target thickness and then etched back to the desired thickness. In one embodiment, the as-grown GaAs based MOSFET structure comprises a GdGaO dielectric stack deposited onto GaAs based epitaxial layers. The target sheet resistivity is 400-500 Ohm/sq. No wet etch solutions nor dry etches were found to etch the gate oxide in a two-dimensional fashion; but rather, three dimensional etching or no etching occurs. Wet solutions investigated included HF, $H_2SO_4$, $HNO_3$, $H_3PO_4$, $C_2H_4O_2$, BOE, HCl, $NH_4OH$, and KOH; concentrated or diluted with $H_2O$, $H_2O_2$ or iso-propanol. Dry etches investigated included $Cl_2$, HBr, $SF_6$, $C_2F_6$, $CHF_3$, $CF_4$ and combinations thereof.

As opposed to wet and dry etches, physical removal of GdGaO using Ar or Kr plasma provides well controlled removal rates with extremely smooth gate oxide surface with a surface roughness rms as low as 1 Å. However, interface damage may occur when films are thinned. For example, physical removal using Ar or Kr plasma can be used to provide complete and controlled two dimensional removal of gate oxide in ohmic contact areas.

In one embodiment, protective layer 18 comprises a protective layer that is deposited onto the semiconductor structure 10 after removal from the oxide deposition system used for depositing the gate oxide 16. It is desirable to minimize the amount of time that the gate oxide is exposed to ambient after removal of the semiconductor structure from the oxide deposition system and prior to application of the protective layer. In one embodiment, aluminum nitride (AlN) is used as the protective layer. A protective layer of AlN was found to be compatible with the gate oxide, i.e. AlN can be deposited and removed without damage to the gate oxide and the underlying oxide-semiconductor interface. Protective layer 18 protects a surface of the gate oxide layer from undesirable contaminants and surface modifications.

In one embodiment, the protective layer is deposited, wherein the AlN deposition is done by sputter deposition without substrate heating. In addition, it is noted that AlN removal can be done using NH$_4$OH or Tetramethyl NH$_4$OH. For further protection, a SiN or SiO layer can be deposited on top of the AlN layer at low substrate temperature. Because of the high atomic hydrogen load during SiN or SiO layer deposition, a process such as jet vapor deposition (JVD) is preferred. In contrast to chemical vapor deposition (CVD), JVD provides SiN and SiO films of excellent quality without substrate heating. The SiO or SiN layer can be selectively removed, as appropriate, using standard processing techniques. In an alternate embodiment, protection layer 18 is optional.

The protective layer functions to minimize surface gettering of contaminants during storage. The protective layer also provides for prevention of impurity diffusion into the oxide and towards the underlying oxide-semiconductor interface during temperature exposure.

Figure 2:
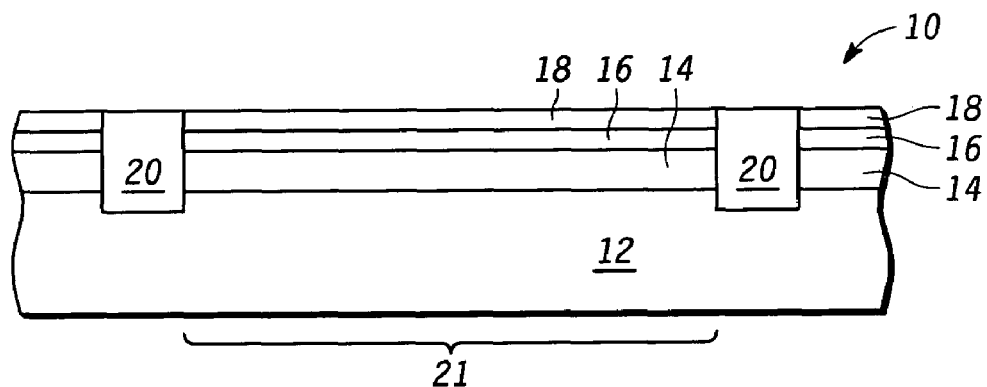
FIG. 2 is a cross-sectional view of the semiconductor structure including device isolation regions during a manufacture thereof according to one embodiment of the present disclosure.

FIG. 2 is a cross-sectional view of the semiconductor structure 10 that further includes device isolation regions 20. Device isolation regions 20 can comprise any device isolation regions suitable for a particular semiconductor device application, further for defining a device active region, indicated by reference numeral 21, disposed in-between the device isolation regions 20. Device isolation regions 20 may be formed, for example, by oxygen implants which are annealed at 400-600° C., mesa etching, or by formation of trenches, fill, and planarization (i.e., formation of shallow trench isolation regions). Oxygen implant and mesa etching are typical in GaAs. However, circuit complexity is limited in case of mesa etched isolation. In one embodiment, device isolation regions 20 comprise shallow trench isolation regions, formed with use of suitable isolation trench, fill, and planarization techniques known in the art. In an alternate embodiment, isolation regions 20 are optional, so long as an active region of the device is appropriately defined using other than isolation regions 20.

During device processing, the protective layer 18 remains in place in regions that correspond to future active areas. Suitable hardmasks for use during isolation trench formation include JVD SiN, SiO, and sputtered AlN. In addition, suitable processing equipment is selected for handling various processing requirements. For example, the gate oxide 16 requires a low temperature, low atomic hydrogen, nitride and/or oxide process. Compatibility with AlN sputtered onto the substrate when not heated has been demonstrated. While CVD SiN and SiO$_2$ processes are most likely incompatible because of combination of atomic hydrogen load and temperature, CVD may be compatible when an AlN protection layer is first used. Alternatively, another solution is JVD which produces high quality SiO$_2$ and SiN without substrate heating.

Figure 3:
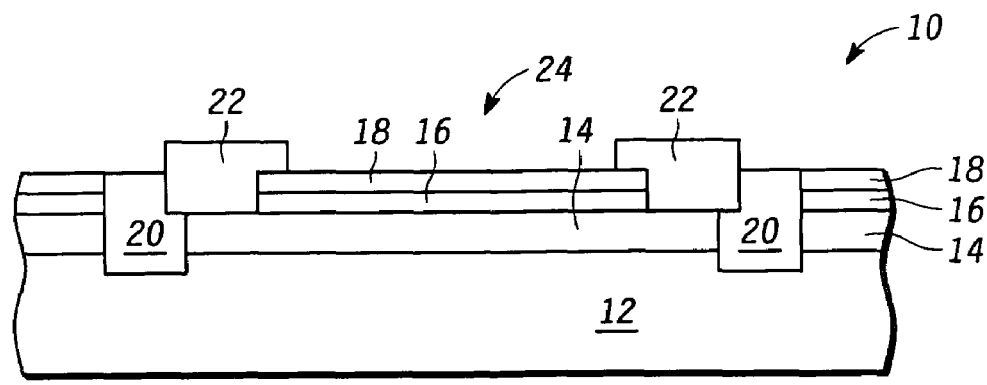
FIG. 3 is a cross-sectional view of the semiconductor structure including ohmic contacts during a manufacture thereof according to one embodiment of the present disclosure.

FIG. 3 is a cross-sectional view of the semiconductor structure 10 that further includes ohmic contacts 22, according to one embodiment of the present disclosure. The formation of ohmic contacts 22 includes forming the ohmic contacts to be coupled to the compound semiconductor substrate (e.g., substrate 12 and epitaxial layer(s) 14) proximate opposite sides of an active region defined within the compound semiconductor substrate and such that an overlap exists between the ohmic contact metal and the gate oxide 16. The overlap prevents the creation of depleted access regions, and thus prevents device failure. Depleted access regions occur when an ohmic contact is laterally separated from an edge of the gate oxide, and wherein a surface portion of the epitaxial layer 14 is exposed. In other words, the overlap prevents formation of a gap between the gate oxide covered surface and the metal contact. The region between contacts 22 has been denoted by the reference numeral 24, as will be discussed further herein.

Formation of ohmic contacts 22 can include use of modified metal schemes for GaAs. In particular, the lateral contact structure differs from a standard contact module in that the lateral contact structures includes an overlap between the respective contact metal and a portion of the gate oxide layer 14, as shown in FIG. 3. In addition, formation of ohmic contacts 22 includes using a suitable rapid thermal anneal (RTA) subsequent to a deposit and patterning of a desired ohmic contact material. Hardmasks used during formation of the ohmic contacts 22 can include JVD SiN, SiO, sputtered AlN. In particular, the photoresist/hardmask scheme is selected to assure that contact metal overlaps the gate oxide layer, as discussed above. In one embodiment, contact metal 22 comprises a palladium/gold (Pd/Au) alloy. In another embodiment, contact metal 22 comprises one or more layers of (i) Ni, (ii) Ge, (iii) Au, or (iv) alloys thereof for GaAs.

Figure 4:
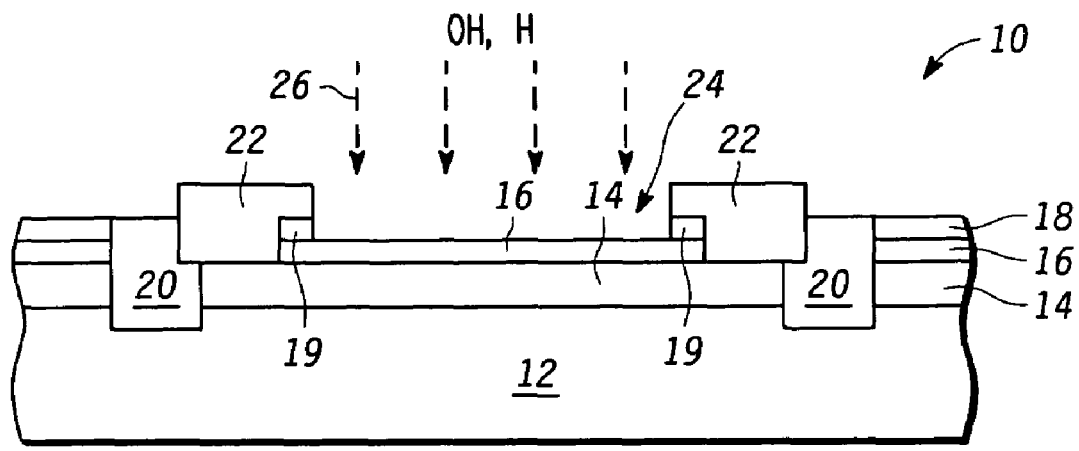
FIG. 4 is a cross-sectional view of the semiconductor structure illustrating a water vapor annealing step during a manufacture thereof according to one embodiment of the present disclosure.

FIG. 4 is a cross-sectional view of the semiconductor structure 10, illustrating a water vapor annealing step, according to one embodiment of the present disclosure. Water vapor annealing is far superior to dry H plasma annealing, in that, water vapor annealing reduces a density of interface states ($D_{it}$) while not damaging the oxide layer 14. There may exist physical defects at the principal interface between the gate insulator layer 16 and the underlying epitaxial layer 14. Each defect is associated with an electrical state. Accordingly, it is desired that the interface state density be controlled to a desired density. In one embodiment, water vapor annealing was found to be efficient with parameters of 320° C., 90 minutes for thick films (on the order of 600 Å) and 270° C., 30-60 minutes for thin films (on the order of <300 Å) on a hotplate. The post deposition anneal (PDA) can be done for the entire active area of a device or only in an immediate gate area. In the latter case, the PDA is included within the gate module, wherein the protective cap layer 18 is temporarily removed prior to PDA, since the cap layer 18 acts as diffusion barrier for H and OH. In one embodiment, the PDA is carried out to yield reduction of a density of interface states of a desired given level, wherein the density of interface states ($D_{it}$) is in a range of less than or equal to $5 \times 10^{11}$ cm$^{-2}$ eV$^{-1}$.

In other words, the protective cap layer 18 is removed in region 24, wherein a portion of the protective cap layer remains in the region of the contact overlap, as indicated by reference numeral 19. Subsequently, the cap layer 18 is re-deposited after PDA, wherein the cap layer not only serves as protection against contaminants but also to improve temperature stability and, consequently, reliability of an interface passivation. Interface passivation starts to degrade above 300° C. without the cap layer 18. A JVD SiN cap layer has also been demonstrated to increase this critical temperature to above 480° C. In one embodiment, the annealing process may use direct substrate heating. In another embodiment, the use of materials that inherently possess a desired reduced density of interface states ($D_{it}$) may render the PDA step unnecessary. In an alternate embodiment, the portion 19 of the protective cap layer may also be removed during removal of the substantial portion of protective cap layer 18, wherein subsequent to the PDA step, a replacement protective cap layer is provided, further as discussed herein.

In one embodiment, the AlN film deposition is done by sputter deposition, the subsequent AlN removal uses MF24a developer. A standard photoresist module includes a photoresist coat (AZ6210), a dip (AZ527), and a bake (135° C., 45 sec). Photoresist removal is accomplished by acetone and isopropanol. The PDA step includes water vapor annealing, as discussed in co-pending patent application Ser. No. 10/882,482, entitled "Method of Passivating Oxide/Compound Semiconductor Interface," filed Jun. 30, 2004, incorporated by reference herein, and is not discussed further here.

Figure 5:
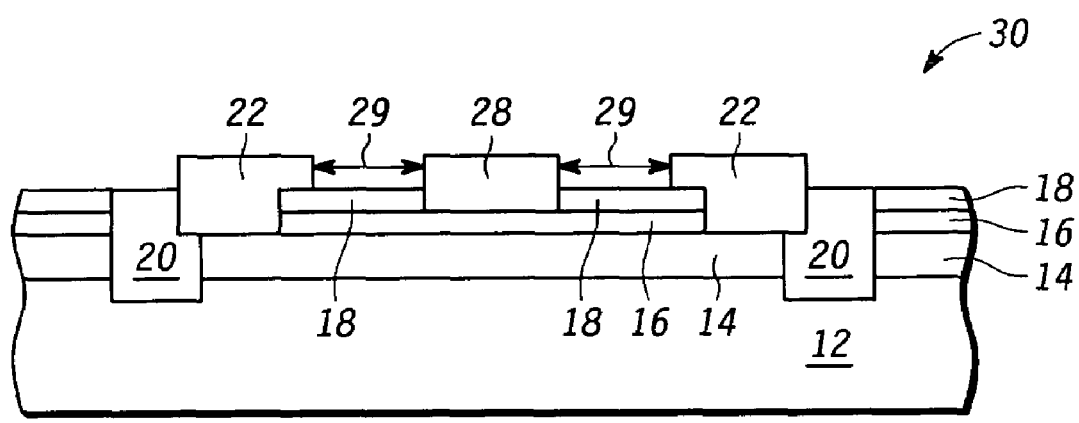
FIG. 5 is a cross-sectional view of the semiconductor device including a gate contact during a manufacture thereof according to one embodiment of the present disclosure.

FIG. 5 is a cross-sectional view of the semiconductor structure 30, including a gate contact 28, according to one embodiment of the present disclosure. Formation of gate contact 28 can comprise use of a suitable backfill gate process similar to PHEMT device manufacturing (lift-off and plating), however, without recess etching. In one embodiment, gate contact 28 can be formed using the following sequence. The AlN protective layer 18 that is in direct contact with the gate oxide 16 is removed in the immediate gate region using NH$_4$OH or Tetramethyl NH$_4$OH without damaging the gate oxide layer 16. The exposed region is subjected to a PDA, if not previously performed for the entire active device area.

Next, a gate metal is deposited. Gate metallization includes a high work function material, such as Pt or Ir, for positive threshold voltages ($V_{th}$). The high work function metal gate is used for enhancement mode operation. In addition, Pt has been found to stick on the gate oxide discussed herein. Hardmasks used during gate contact formation can include JVD SiN, SiO, or sputtered AlN. The protective cap layer in the access areas between gate and drain and gate and source, as illustrated by reference numeral 29, preferentially removes trapped negative charge from the surface of the gate insulator layer 16. It is expected that negative charge on the surface of the gate insulator layer 16 in the access areas proportionally reduces the maximum available current $I_{max}$, e.g. for a sheet carrier density $n_s=2\times10^{12}$ cm$^{-2}$ in the epitaxial layer 14, and a trapped charge $N_t=-2\times10^{11}$ cm$^{-2}$ on the surface of the gate oxide layer 16, $I_{max}$ is reduced by about 10% in agreement with the 10% reduction of sheet carrier density ($n_s$) due to trapped surface charge.

The device 30 can further include a step gate or field plate. Power devices need extra measures to increase a breakdown voltage. Since $D_{it}$ is low, a T-gate may already serve as step gate when a proper distance between the upper bar of the T and the device surface is realized.

According to one embodiment, the workfunction of the gate contact 28 is selected according to the desired device type. For implant-free MOSFETs, a high workfunction is desired. The gate metal contact electrode can comprises Pt or Ir, wherein Pt and Ir have a workfunctions on the order of 5.6 and 5.3 eV, respectively.

The semiconductor device 30 can be processed further according to the requirements of the particular semiconductor device application. For example, further processing of semiconductor device 30 may include plating, via formation, metal2, etc. using suitable GaAs processing steps.

According to one embodiment of the present disclosure, a method of making a III-V compound semiconductor device includes using one or more of (i) a GdGaO/Ga$_2$O$_3$ dielectric stack used in the FET flow, (ii) a protective layer (specifically AlN) for oxide and oxide/semiconductor interface protection and interface passivation retention, (iii) ohmic contacts overlapping oxide to prevent depletion of channel, (iv) high workfunction gate to allow enhancement mode operation. Advantages and benefits provided by the embodiments of the present disclosure include, but are not necessarily limited to, one or more of the following: (i) for RF applications, higher performance, e.g. higher $I_{max}$, smaller die size, more flexible circuit designs, better linearity, lower noise, higher integration levels; (ii) combination of MOS advantages (ruggedness, scalability, integration) with advantages of III-Vs (higher efficiency, better frequency performance); or (iii) for digital, it will introduce a successful Si MOS concept of 2-D scaling into the III-V world.

According to one embodiment of the present disclosure, a compound semiconductor heterostructure MOSFET process flow includes use of a GdGaO/Ga$_2$O$_3$ dielectric stack as a gate oxide overlying a GaAs epitaxial layer. The process flow further includes using a gate oxide cap layer, device isolation implants, ohmic contacts, post deposition annealing before gate contact metal deposition, and gate contact metal deposition, as discussed further herein. The gate oxide cap layer can include an ex-situ or in-situ deposited gate oxide cap layer. The gate oxide cap layer (i) protects an underlying gate oxide surface from contamination and hydrogen load during deposition of oxides and nitrides (e.g. CVD of oxides and nitrides), (ii) substantially improves a thermal stability of hydrogen or deuterium passivation of the Ga$_2$O$_3$/GaAs interface, (ii) allows building of nitride/oxide layer structures during processing steps, and (iii) has a substantially one-hundred percent (100%) etch selectivity. In one embodiment, the gate oxide cap layer comprises a nitride such as AlN. The device isolation implants are formed in direct contact with the GdGaO/Ga$_2$O$_3$ gate dielectric stack. The ohmic contacts are formed in direct contact with the GdGaO/Ga$_2$O$_3$ gate dielectric stack. Post deposition annealing is performed before gate contact metal deposition. In addition, gate contact metal deposition occurs after forming a suitable opening in the protective layer.

According to one embodiment, a III-V based, implant free MOS heterostructure field-effect transistor device includes: a gate insulator layer overlying a compound semiconductor substrate; ohmic contacts coupled to the compound semiconductor substrate proximate opposite sides of an active device region defined within the compound semiconductor substrate; and a gate metal contact electrode formed on the gate insulator layer in a region between the ohmic contacts. The ohmic contacts have portions thereof that overlap with portions of the gate insulator layer within the active device region. The overlapping portions ensure avoidance of an undesirable gap formation between an edge of the ohmic contact and a corresponding edge of the gate insulator layer.

In another embodiment, the gate insulator layer/compound semiconductor interface comprises an annealed interface. In this instance, the gate insulator layer/compound semiconductor interface is annealed with a water vapor anneal to reduce a density of interface states ($D_{it}$) therein to a desired level. The desired level of density of interface states ($D_{it}$) is on the order of less than or equal to $5\times10^{11}$ cm$^{-2}$ eV$^{-1}$. The device can further include a protective layer overlying the gate insulator layer. In addition, the ohmic contacts can also include having a portion thereof that overlaps with the protective layer and the gate insulator layer, further wherein the gate metal contact electrode is formed through an opening in the protective layer at a desired location of the gate metal contact electrode.

In yet another embodiment, the insulator layer comprises a gate oxide layer, wherein the gate oxide layer comprises a high-k gate dielectric stack, the high-k gate dielectric stack providing low density of interface states ($D_{it}$) and low leakage, the low $D_{it}$ including a midgap $D_{it}$ at approximately $10^{11}$ cm$^{-2}$ eV$^{-1}$ and the low leakage including a leakage current of approximately 10 nA/cm$^2$ at 1 MV/cm. For example, the high-k gate dielectric stack can comprise a Gd$_x$Ga$_{0.4-x}$O$_{0.6}$/Ga$_2$O$_3$ gate dielectric stack. In still another embodiment, the gate insulator layer comprises a deposited gate oxide layer having a desired target thickness.

In other embodiments, the device further comprises isolation regions for defining the active device region, the isolation regions including one selected from the group consisting of isolation implant regions, shallow trench isolation regions, and mesa isolation regions. In addition, the ohmic contacts can include one or more of nickel (Ni), germanium (Ge), palladium (Pd), and gold (Au). Furthermore, the gate metal contact electrode can comprise an electrode formed using a backfill gate process of lift-off and plating without recess etching. Still further, the gate metal contact electrode can comprise a gate metallization that includes a high workfunction material of Pt or Ir for positive threshold voltages ($V_{th}$), the high work function gate metal contact electrode for enabling an enhancement mode operation.

In yet another embodiment, the device can further include a protective layer overlying the gate insulator layer, wherein the gate metal contact electrode is formed through an opening in the protective layer at a desired location of the gate metal contact electrode. Still further, the gate insulator layer can comprise a water vapor annealed gate insulator layer/compound semiconductor interface having a density of interface states ($D_{it}$) therein reduced to a desired level from an initial as-grown level.

The embodiments disclosed herein are applicable across all III-V semiconductors, and as such, capture a broad concept. The embodiments are applicable to analog, digital, and mixed signal circuitry. In other words, compound semiconductor heterostructure MOSFET devices formed according to the embodiments of the method of the present disclosure can be used in a variety of RF and mixed signal semiconductor circuits. RF and mixed signal semiconductor circuits can include, for example, mobile, wireless products such as handsets, wireless local area networks (WLAN), and digital heterointegration type applications.

In the foregoing specification, the disclosure has been described in reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the present embodiments can apply to semiconductor device technologies where a GdGaO/$Ga_2O_3$ dielectric stack is used as a gate oxide. The present embodiments can further apply to implant-free MOSFETs.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A III-V based, implant free MOS heterostructure field-effect transistor device comprising:
    a gate insulator layer overlying a compound semiconductor substrate, wherein the gate insulator layer/compound semiconductor interface comprises an annealed interface, the gate insulator layer/compound semiconductor interface having been annealed with a water vapor anneal to reduce a density of interface states ($D_{it}$) therein to a desired level;
    ohmic contacts coupled to the compound semiconductor substrate proximate opposite sides of an active device region defined within the compound semiconductor substrate, the ohmic contacts having portions thereof that overlap with portions of the gate insulator layer within the active device region, the overlapping portions ensuring avoidance of an undesirable gap formation between an edge of the ohmic contact and a corresponding edge of the gate insulator layer; and
    a gate metal contact electrode formed on the gate insulator layer in a region between the ohmic contacts, further comprising:
    a protective layer overlying the gate insulator layer, wherein the ohmic contacts further include the ohmic contacts having a portion thereof that overlaps with the protective layer and the gate insulator layer, further wherein the gate metal contact electrode is formed through an opening in the protective layer at a desired location of the gate metal contact electrode, wherein the protective layer comprises an aluminum nitride (AlN) layer.

2. The device of claim 1, wherein the desired level of density of interface states ($D_{it}$) is on the order of less than or equal to $5 \times 10^{11}$ $cm^{-2}$ $eV^{-1}$.

3. The device of claim 1, wherein AlN layer comprises a sputter deposited layer.

4. The device of claim 1, further comprising:
    one of a SiN or SiO layer disposed on the AlN protection layer.

5. The device of claim 1, wherein the protective layer is configured for minimizing surface gettering of contaminants during storage, the protective layer also being configured for prevention of impurity diffusion into the insulator layer and towards an underlying insulator layer/compound semiconductor interface during a given temperature exposure.

6. The device of claim 1, wherein the compound semiconductor substrate comprises a III-V substrate with one or more epitaxial layers thereon, further wherein the III-V substrate comprises one of GaAs or InP.

7. The device of claim 6, further wherein the one or more epitaxial layers comprise any suitable layer structure of one or more of In, Ga, P, As, Sb, or Al containing compounds.

8. The device of claim 1, wherein the insulator layer comprises a gate oxide layer.

9. The device of claim 8, wherein the gate oxide layer comprises a high-k gate dielectric stack, the high-k gate dielectric stack providing low density of interface states ($D_{it}$) and low leakage, the low $D_{it}$ including a midgap at approximately $10^{11}$ $cm^{-2}$ $eV^{-1}$ and the low leakage including a leakage current of approximately 10 nA/$cm^2$ at 1 MV/cm.

10. The device of claim 9, wherein the high-k gate dielectric stack comprises a $Gd_xGa_{0.4-x}O_{0.6}$/$Ga_2O_3$ gate dielectric stack.

11. The device of claim 1, wherein the gate insulator layer comprises a deposited gate oxide layer having a desired target thickness.

12. The device of claim 1, further comprising isolation regions for defining the active device region, the isolation regions comprising one selected from the group consisting of isolation implant regions, shallow trench isolation regions, and mesa isolation regions.

13. The device of claim 1, wherein the ohmic contacts comprise one or more of nickel (Ni), germanium (Ge), palladium (Pd), and gold (Au).

14. The device of claim 1, wherein the gate metal contact electrode comprises a gate metallization that includes a high workfunction material of Pt or Ir for positive threshold voltages ($V_{th}$), the high work function gate metal contact electrode for enabling an enhancement mode operation.

* * * * *